US006022415A

United States Patent [19]
Amano

[11] Patent Number: 6,022,415
[45] Date of Patent: Feb. 8, 2000

[54] SPHERICAL ARTICLE CONVEYING ATMOSPHERE REPLACING DEVICE

[75] Inventor: Katsumi Amano, Fukuoka, Japan

[73] Assignee: Mitsui High-Tec Inc., Fukuoka, Japan

[21] Appl. No.: 09/095,841

[22] Filed: Jun. 11, 1998

[30] Foreign Application Priority Data

Aug. 11, 1997 [JP] Japan .................................... 9-216868

[51] Int. Cl.[7] ............................ C23C 16/00; H01L 25/00

[52] U.S. Cl. .......................... 118/719; 136/250; 118/724; 118/725; 118/715

[58] Field of Search .................................... 118/715–733; 136/250

[56] References Cited

U.S. PATENT DOCUMENTS 4,226,208 10/1980 Nishida et al. ......................... 118/706
4,430,150 2/1984 Levine et al. ........................... 156/616
5,112,185 5/1992 Koike ...................................... 414/786
5,278,097 1/1994 Hotchkiss et al. ....................... 437/164
5,738,771 4/1998 Yoshida .............................. 204/298.24

*Primary Examiner*—Shrive Beck
*Assistant Examiner*—R. Hendrix
*Attorney, Agent, or Firm*—Greenblum & Bernstein, P.L.C.

[57] ABSTRACT

A spherical article conveying atmosphere replacing device includes a recovering chamber which a recovering pipe penetrates; a pressure reducing device (or recovering pump) for making the inside of the recovering chamber negative in pressure; a sending chamber which a sending pipe penetrates which is coupled to the recovering pipe; and a pressurizing device (or sending pump) for making the inside of the sending chamber positive in pressure, so that the atmosphere for the spherical single crystal silicon conveyed in the recovering pipe is recovered in the recovering chamber with high efficiency which is negative in pressure, and in the sending chamber the spherical single crystal silicon in the sending pipe are accelerated.

15 Claims, 7 Drawing Sheets

3
2

7a
7
6

SPHERICAL ARTICLE CONVEYING ATMOSPHERE REPLACING DEVICE

BACKGROUND OF THE INVENTION

1. Field of the Invention

This invention relates to a spherical article conveying atmosphere replacing device which is used when spherical articles such as spherical semiconductor chips are conveyed through different atmospheres.

2. Description of the Related Art

Hitherto, semiconductor apparatuses have been manufactured by a method having the steps of forming a circuit pattern on a silicon wafer and dicing the silicon wafer as required so that semiconductor chips are formed. Under the above-mentioned circumstance, a technology has been suggested with which a circuit pattern is formed on a spherical semiconductor (a ball semiconductor) made of single crystal silicon.

When, for example, spherical single crystal silicon is employed to form discrete devices, such as solar cells or optical sensors, or semiconductor integrated circuits, a variety of processes must be performed which consist of processes for mirror-polishing and cleaning the spherical single crystal silicon, a process for forming a thin film, a process for coating resist, a photolithography process, an etching process and the like. In order to efficiently manufacture the spherical semiconductor devices, the various processes and conveying processes must be connected to one another so as to form a system line.

In the above-mentioned manufacturing system line, in addition to gases, such as active gases and inert gases, each process is performed in a variety of atmospheres including fluids such as water and various solutions. When the processes are connected to one another to form a manufacturing line, introduction of the atmosphere for conveying spherical articles from the previous process into the following process must be prevented. That is, removal of the atmosphere of the previous process from the spherical articles is required between the processes. Then, the atmosphere must be converted into an atmosphere suitable for the following process when the spherical articles are conveyed. Moreover, the above-mentioned process requires high speed and satisfactory reliability to improve the productivity and the quality.

The present Applicant has disclosed a device which, while preventing the leakage of the atmosphere between a process into the following process, processes and conveys a spherical article at high speed. More specifically, he has disclosed a spherical article atmosphere replacing device in which, while conveying spherical articles in a rotation mode which are accommodated in a accommodating chamber around a rotary receiver, changes the atmosphere in the accommodating chamber sequentially.

However, in the atmosphere replacing device with a rotor such as the aforementioned rotary receiver, in order to introduce spherical articles into the accommodating chambers of the rotor or to discharge them therefrom, the timing of introducing or discharging a spherical article must be synchronous with the rotation of the aforementioned rotor. For this purpose, it is necessary to confirm the position of the spherical article with a sensor, thereby to control the operation of the device. Therefore, the device suffers from the difficulty that it must be provided with an intricate control mechanism.

At the inlet and the outlet of the aforementioned accommodating chamber, the seal member which is provided to completely block the atmosphere is liable to form fine particles.

Furthermore, in order to prevent spherical articles from being damaged by friction and toe convey them with high efficiency, in the accommodating chamber it is necessary to provide a purge to float the spherical articles. Accordingly, the rotor is intricate in configuration.

SUMMARY OF THE INVENTION

Accordingly, an object of the invention is to overcome the above-described difficulties accompanying a conventional spherical article conveying atmosphere replacing device.

More specifically, an object of the invention is to provide a spherical article conveying atmosphere replacing device which is simple in mechanism, and while conveying spherical articles at high speed, prevents the leakage of an atmosphere from a process to the following process.

Another object of the invention is to positively achieve a semiconductor process such as a film forming process and an etching process of a spherical article semiconductor such as a spherical single crystal silicon.

The foregoing objects and other objects of the invention have been achieved by the provision of a spherical article conveying atmosphere replacing device which comprises:

a recovering chamber which a recovering pipe penetrates;

a pressure reducing device for making the inside of the recovering chamber negative in pressure;

a sending chamber which a sending pipe penetrates; and a pressurizing device for making the inside of the sending chamber positive in pressure, the recovering pipe being connected to the sending pipe, through-holes being formed in the side wall of the recovering pipe which is located inside the recovering chamber and in the side wall of the sending pipe which is located inside the sending chamber.

In this specification, the term "atmosphere" as herein used is intended to mean that it includes not only gases such as active gas and inert gas but also liquids such as water and various solutions, and the term "spherical articles" as herein used is intended to means that they includes not only spherical silicon but also spherical article of various materials which are treated in a variety of atmospheres.

The nature, utility and principle of the invention will be more clearly understood from the following detailed description and the appended claims when read in conjunction with the accompanying drawings.

A first aspect of the present invention is a spherical article conveying atmosphere replacing device, which comprises:

a recovering chamber which a recovering pipe penetrates;

a pressure reducing device for making the inside of said recovering chamber negative in pressure;

a sending chamber which a sending pipe penetrates; and a pressurizing device for making the inside of said sending chamber positive in pressure, said recovering pipe being connected to said sending pipe, through-holes being formed in the side wall of said recovering pipe which is located inside said recovering chamber and in the side wall of said sending pipe which is located inside said sending chamber.

A second aspect of the device is a device according to the first aspect ,wherein said recovering pipe is made of a porous material.

A third aspect of the device is a device according to the first aspect, wherein said through-holes formed in said side wall of said sending pipe are inclined from the outer cylindrical surface of said sending pipe to the inner cylindrical surface of said sending pipe in the direction of conveyance of materials to be processed.

A fourth aspect of the device is a device according to the first aspect, which further comprises:

a plurality of piezo-electric elements mounted on said sending pipe at predetermined intervals so as to locally reduce the inside diameter of said sending pipe.

A fifth aspect of the device is a device according to the fourth aspect, wherein said piezo-electric elements are a first piezo-electric element positioned downstream, and a second piezo-electric element positioned upstream which are arranged with a distance which corresponds substantially to the outside diameter of materials to be processed, so that said first piezo-electric element is operated slightly earlier than said second piezo-electric element, thereby after a material to be processed is held between a first diameter-reducing portion whose diameter is momentarily reduced by said first piezo-electric element and a second diameter-reducing portion whose diameter is reduced by said second piezo-electric element, said first diameter-reducing portion is restored, and said material to be processed is conveyed by a force which is momentarily provided by said second diameter-reducing portion in the direction of conveyance.

A sixth aspect of the device is a device according to the first aspect, which comprises a plurality of said recovering chambers or sending chambers.

A seventh aspect of the device is a device according to the first aspect, wherein at least one pair of a gas supply chamber and a gas discharging chamber are provided between said recovering chamber and said sending chamber, said gas supplying chamber comprising a gas supplying pipe connected to said recovering pipe, a supplying chamber which said gas supplying pipe penetrates, and a supplying device for supplying gas into said supplying chamber to make said supplying chamber positive in pressure, said gas discharging chamber comprising a gas discharging pipe which is connected to said gas supplying pipe, a discharging chamber which said gas discharging pipe penetrates, and a pressure reducing device for making the inside of said discharging chamber negative in pressure, said gas discharging pipe being coupled to said sending pipe.

A eighth aspect of the device is a device according to the first aspect, wherein said gas is an inert gas.

A ninth aspect of the device is a device according to the first aspect, in which said supplying chamber is so designed that an inert gas whose temperature is controlled to a predetermined value is supplied thereto.

A eighth aspect of the device is a device according to the first aspect, wherein said gas is a reactive gas, and said supplying chamber is a reaction chamber to which a reactive gas whose temperature is controlled to a predetermined value is supplied to perform a film forming operation or etching operation.

A eleventh aspect of the device is a device according to the seventh aspect, wherein more than one pair of said gas supplying chambers and said gas discharging chambers, and gases supplied into said gas supplying chambers are controlled to different values in temperature.

A twelfth aspect of the device is a device according to the eleventh aspect, wherein each of said spherical articles is a spherical single crystal silicon, said gas supplying chamber is made up of a first gas supplying chamber located upstream as viewed in the direction of conveyance of spherical articles, and a second gas supplying chamber located downstream, said first gas supplying chamber is a nitriding chamber into which a nitrogen-contained gas whose temperature is controlled to a nitriding temperature, to perform a nitrogen annealing operation, and said second gas supplying chamber is a temperature adjusting chamber adapted to supply gas at room temperature.

A thirteenth aspect of the device is a device according to the seventh aspect, wherein gases supplied into said gas supplying chambers are different from each other in composition.

A fourteenth aspect of the device is a device according to the thirteenth aspect, wherein said gas supplying chamber is made up of a first gas supplying chamber located upstream as viewed in the direction of conveyance of spherical articles, and a second gas supplying chamber located downstream, said first gas supplying chamber is a first film forming chamber into which a first reactive gas whose temperature is controlled to a predetermined value is supplied, to form a first film and said second gas supplying chamber is a second film forming chamber into which a second reactive gas whose temperature is controlled to a predetermined value is supplied, to form a second film.

A fifteenth aspect of the device is a device according to the first aspect, further comprising:

rotating means for rotating said sending pipe at high speed with respect to said sending chamber, so that said gas supplied into said sending pipe forms a whirling stream of gas.

BRIEF DESCRIPTION OF THE DRAWINGS

In the accompanying drawings.

DETAILED DESCRIPTION OF THE INVENTION

Preferred embodiments of the invention will be described with reference to the accompanying drawings; however, the invention is not limited thereto or thereby.

First Embodiment

Figure 1:
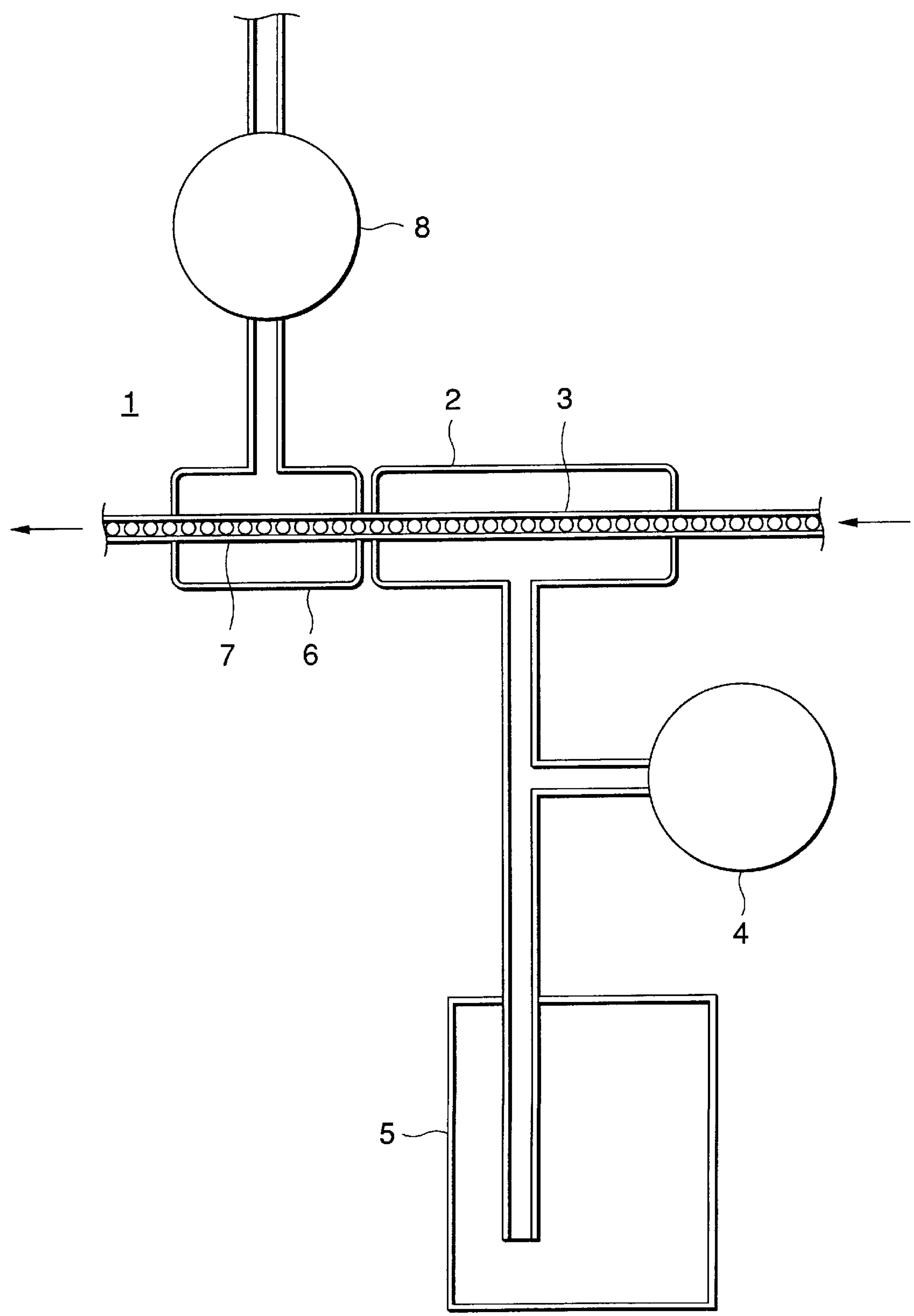
FIG. 1 is a sectional view showing an example of a spherical article conveying atmosphere replacing device, which constitutes a first embodiment of the invention.

An example of a conveying atmosphere replacing device, which constitutes a first embodiment is as shown in FIG. 1.

In FIG. 1, reference numeral 1 designates the aforementioned conveying atmosphere replacing device. The device 1 comprises a recovering chamber 2, and a sending chamber 6. The space in the recovering chamber is connected through pipes to a means for reducing an atmosphere, namely, a recovering pump 4, and a recovering tank 5 which is cool down to a predetermined temperature; while the space in the sending chamber 6 is connected through a pipe to pressurizing means, namely, a sending pump 8.

Figure 2:
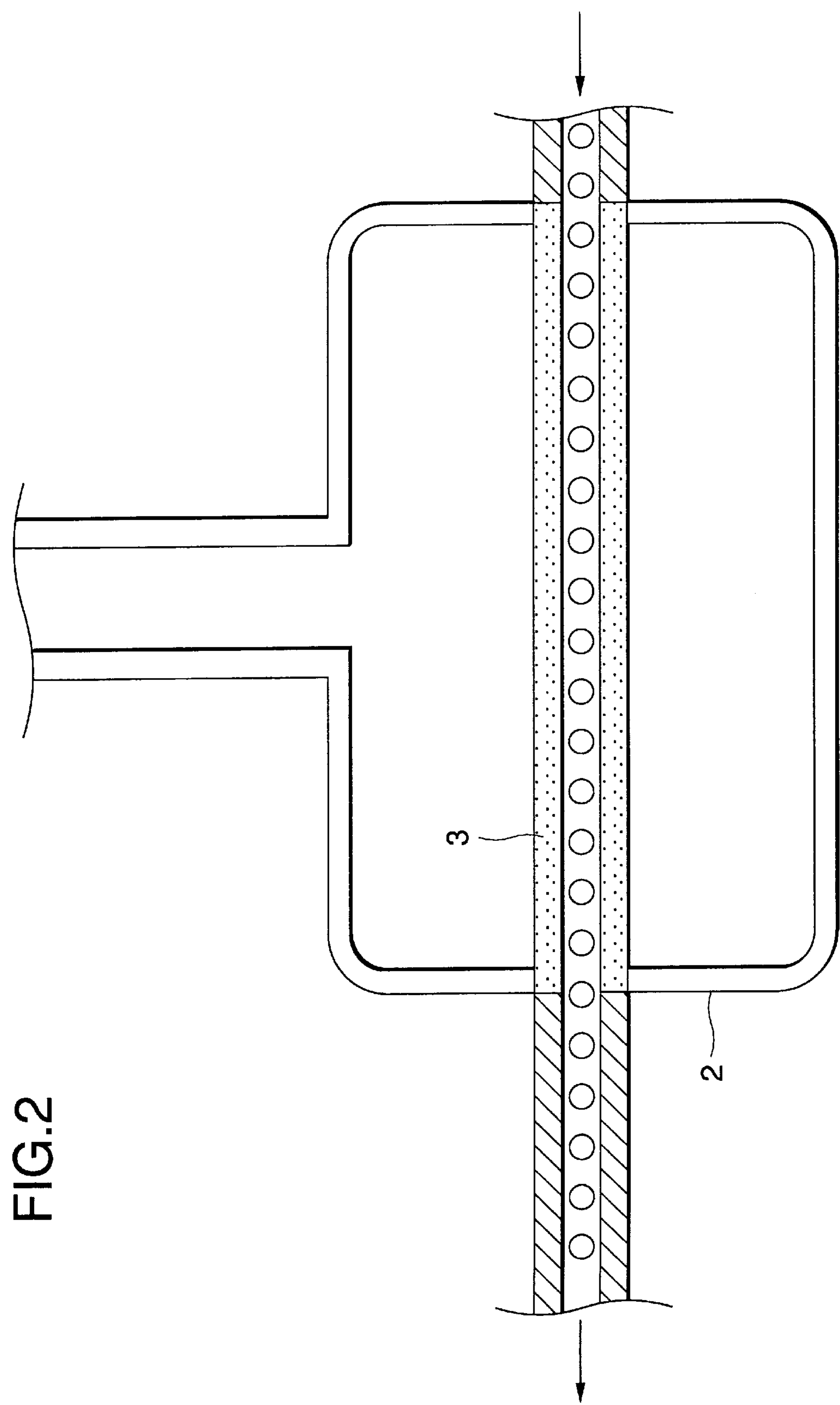
FIG. 2 is an enlarged sectional view for a description of a recovery pipe in the device of the invention.

As shown in FIG. 2, a recovering pipe of porous material penetrates the recovering chamber 2. The pressure in the recovering chamber 2 is decreased by means of the recovering pump 4, so that the inside of the recovering chamber 2 is negative in pressure with respect to the inside of the recovering pipe 3; that is, the gas in the recovering pipe is introduced through the pores therein into the recovering tank. The aforementioned porous material is obtained, for instance, by sintering powder of ceramic, resin and metal.

One end of the recovering pipe 3 is coupled to a pretreatment device (not shown) such as low pressure chemical vapor deposition (LPCVD) device, and receives spherical articles (spherical single crystal silicon) which, being processed in the preceding process, is covered with a CVD oxide film. The other end of the recovering pipe 3 is connected to a sending pipe 7, and sends the spherical articles into the sending pipe 7 under the condition that the atmosphere such as monosilane ($SiH_4$) and $N_2O$ gas has been removed.

In the above-described embodiment, the recovering pipe is made of the porous material; however, the invention is not limited thereto or thereby. That is, a number of through-holes may be formed in the side wall of the recovering pipe 3 which is located inside the recovering chamber 2. The material of the recovering pipe 3 may be ceramic, resin, metal in correspondence to the conveying atmosphere such as inert gas and water, or the aforementioned materials coated with resin.

The number and diameter of the through-holes formed in the sidewall of the recovering pipe 3 may be set to suitable values in a range with which the spherical articles are smoothly conveyed.

In the case where the recovering pipe is made of the porous material, it is unnecessary to additionally form a number of through-holes in the side wall of the recovering pipe 3. Hence, in this case, the recovering pipe manufacturing cost can be reduced as much. Because of the pressure difference provided by the recovering pump 4, the atmosphere such gas in the recovering pipe is introduced through the recovering chamber 2 into the recovering tank. In this operation, since the atmosphere such as gas is removed through the whole inner cylindrical surface of the recovering pipe 3, the atmosphere is scarcely left in the recovering pipe 3.

In the case where the recovering pipe 3 is made of resin, it is preferable to employ fluoro-resin because the latter is high in heat resistance and in chemical resistance, and can be subjected to sintering.

Figure 3:
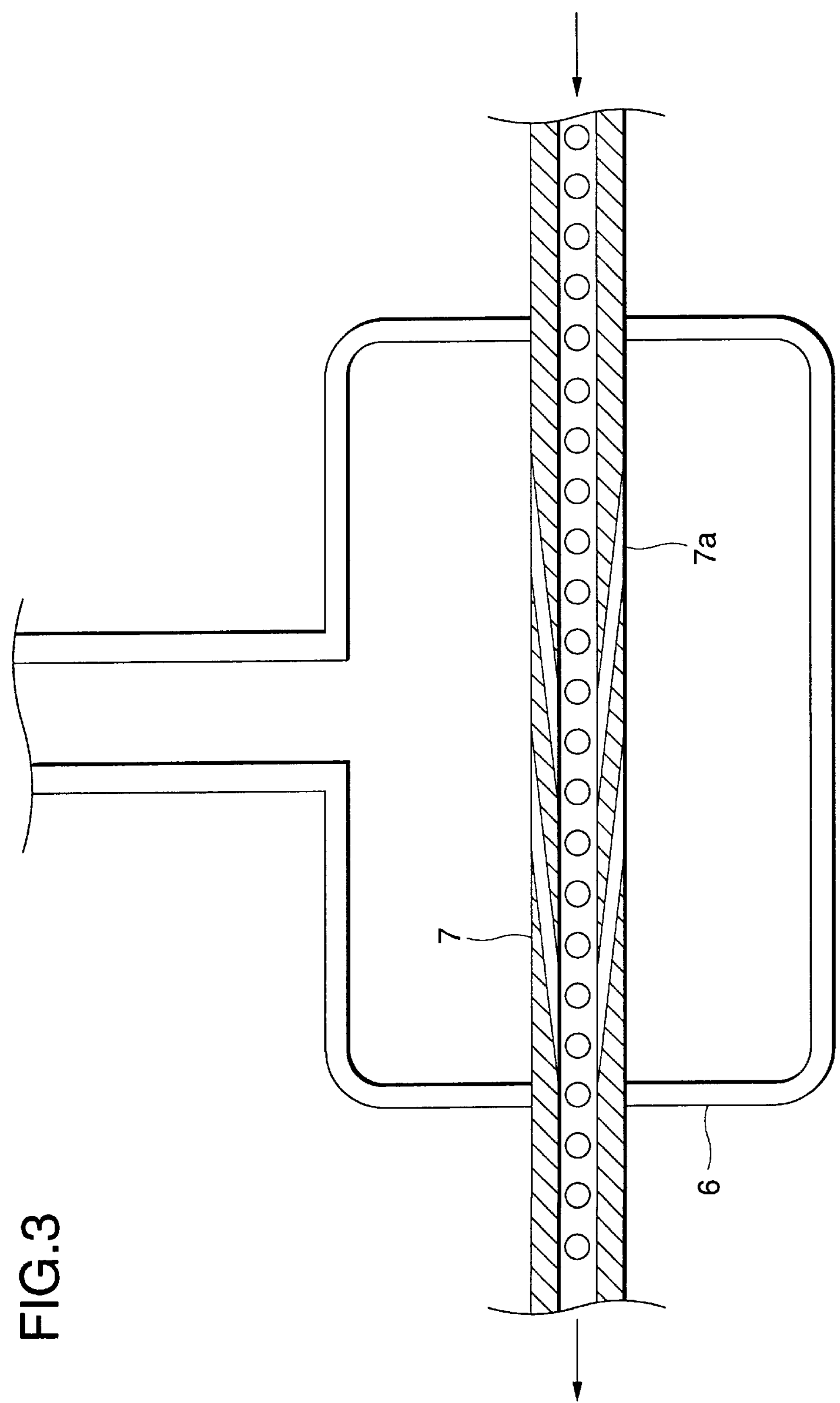
FIG. 3 is an enlarged sectional view showing through-holes formed in the side wall of a sending pipe in the device of the invention.

On the other hand, similarly as in the case of the recovering chamber 2, the sending pipe 7 penetrates the sending chamber 6. As shown in FIG. 3, one end of the sending pipe 7 is coupled to the aforementioned recovering pipe 3, and receives spherical articles from the recovering pipe 3. The other end of the sending pipe 7 is extended outside the sending chamber, and is coupled to the following processing device (not shown). Under this condition, the sending pump 8 is operated to supply inert gas to send spherical articles to the following process.

The material of the sending pipe 7 may be the same as that of the recovering pipe 3.

As shown in FIG. 3, a number of small through-holes 7*a* are formed in the side wall of the sending pipe 7 which is located inside the sending chamber 6. The direction of each of the small through-holes are inclined from the outer cylindrical surface of the sending pipe 7 to the inner cylindrical surface of the latter 7 in the direction of conveyance of spherical articles in the sending pipe. The number, the positions, and the angle of inclination of the through-holes 7*a* must be so determined that the spherical balls are smoothly conveyed. The configuration of the through-holes 7*a* is not limited to that which is shown in FIG. 3.

Now, the operation of the conveying atmosphere replacing device 1 will be described.

The pressure in the recovering chamber 2 is made negative with respect to that in the recovering pipe by means of the recovering pump 4, and the pressure in the inside of the recovering pipe 3 is also made negative with the aid of a number of through-holes formed therein. Since the pressure in the recovering pipe 3 is negative as was described above, the spherical articles are sucked into the recovering pipe 3 from the pretreatment device, and smoothly conveyed into the recovering chamber 2.

When the spherical articles processed in the preceding process reach the inside of the recovering chamber 2, the atmosphere such as gas which is conveyed together with the spherical articles and used in the preceding process is sucked into the inside of the recovering chamber 2 from the recovering pipe 3 through the aforementioned through-holes formed in the side wall of the latter 3. The atmosphere thus sucked is collected through the pipe in the recovering tank 5 which has been cooled down to a predetermined temperature. In order to perform the recovery of the atmosphere with high efficiency, it is preferable that the temperature of the space in the recovering chamber 2 is controlled to a predetermined value.

On the other hand, the pressure in the sending chamber 6 is maintained positive by means of the sending pump 8, so that an atmosphere such as inert gas or reactive gas which is used in the following process is introduced into the sending pipe 7 through the aforementioned through-holes 7*a*.

As was described above, the through-holes 7*a* are so formed that they are small in diameter and inclined from the outer cylindrical surface of the sending pipe 7 to the inner cylindrical surface of the latter in the direction of conveyance of spherical articles in the sending pipe 7. Therefore, an atmosphere such as gas used in the following process is jetted into the sending pipe 7 at high speed.

Inside the sending pipe 7, the portion upstream of the through-holes 7*a* is reduced in pressure by the action of the flow of the aforementioned atmosphere.

Accordingly, under the condition that the suction of the atmosphere used in the preceding process has been accomplished, the spherical articles existing in the recovering pipe 3 is sucked into the sending pipe 7 from the recovering pipe 3 as if they were sucked in a vacuum, and then they are smoothly conveyed to the following process by the flow of the atmosphere.

As was described above, in the invention, the atmosphere used in the preceding process is sucked and removed from the recovering pipe 3 through the inside of the recovering chamber 2, while the atmosphere to be used in the following process is introduced into the sending pipe 7 through the sending chamber 6. Hence, those atmospheres are not mixed with each other. In the above-described operation, the spherical articles are conveyed smoothly, and on the spherical article conveying path the replacement of the atmosphere can be achieved quickly.

Second Embodiment

Another example of the spherical article conveying atmosphere replacing device, which constitutes a second embodiment of the invention will be described.

Figure 4:
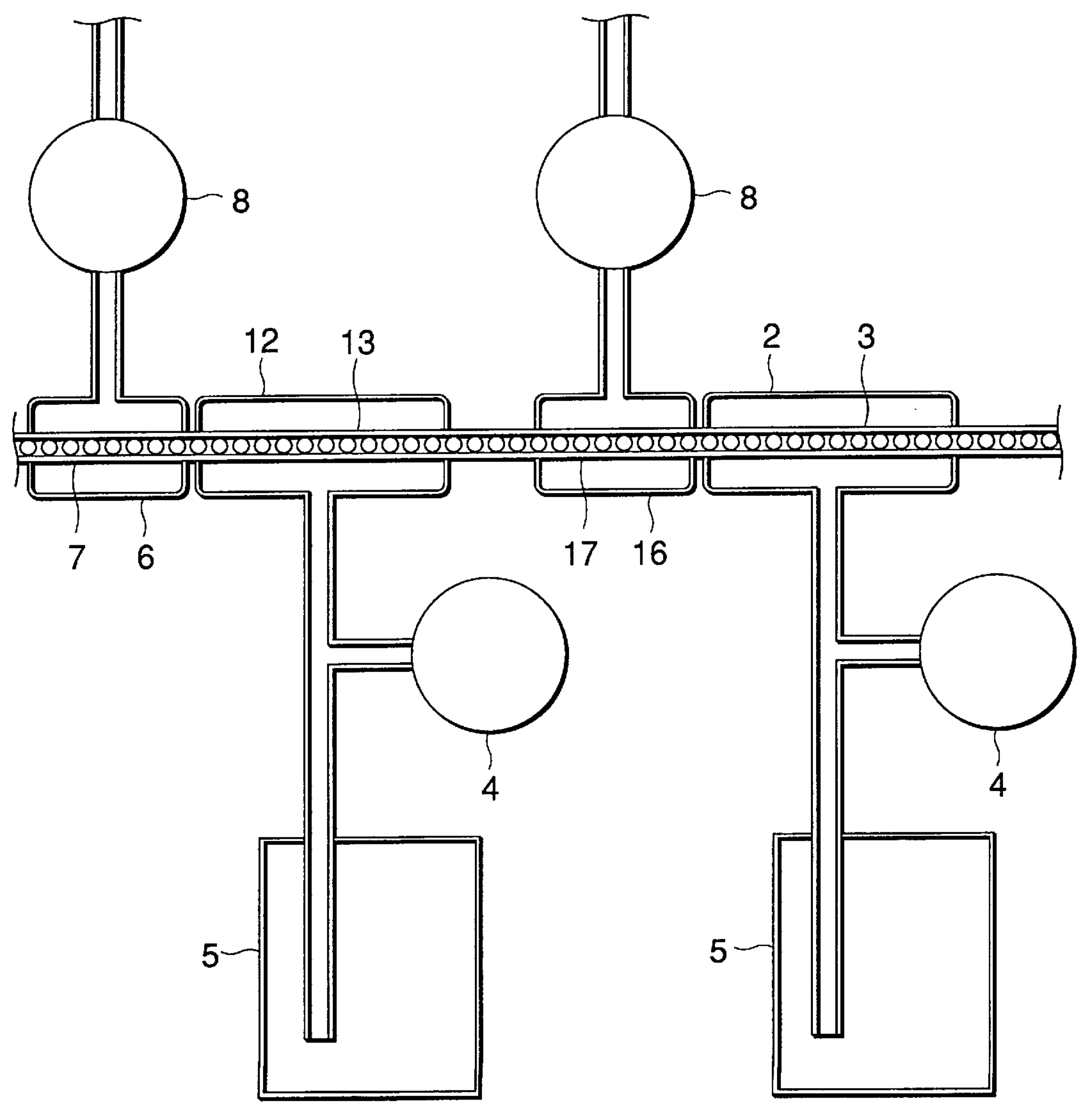
FIG. 4 is a sectional view showing another example of the spherical article conveying atmosphere replacing device, which constitutes a second embodiment of the invention.

In the case where a gas or liquid high in reaction characteristic is used in the preceding process, as shown in FIG. 4 an inert gas supplying chamber 16 and an inert gas recovering chamber 12 may be provided to add an inert gas replacing process. In FIG. 4, reference numerals 17 and 12 designate a supplying pipe and a recovering pipe, respectively, which are made of porous material. In FIG. 4, parts corresponding functionally to those already described with reference to FIGS. 1 through 3 are therefore designated by the same reference numerals or characters.

In the above-described spherical article conveying atmosphere replacing device, the gas used in the preceding process can be satisfactorily replaced with an inert gas; that is, the gas used in the preceding procedure is prevented from remaining in the following procedure. In this connection, a plurality of pairs of inert gas supplying chambers and inert gas recovering chambers may be juxtaposed, so that the replacement of the atmosphere is achieved in steps.

Alternatively, a plurality of recovering chambers 2 or sending chambers may be juxtaposed so that the suction of the atmosphere by means of the recovering chambers or the introduction of the atmosphere by means of the sending chambers may be repeated predetermined times.

In the second embodiment, the atmosphere used in the preceding process can be positively replaced with the atmosphere to be used in the following process, and the conveyance of spherical single crystal silicon can be achieved more quickly.

Third Embodiment

Another example of the spherical article conveying atmosphere replacing device, which constitutes a third embodiment of the invention, will be described with reference to FIG. 5, in which parts corresponding functionally to those already described with reference to FIGS. 1 and 2 are therefore designated by the same reference numerals or characters. The device, the third embodiment, is obtained by adding an intermittent drive device to the device (FIG. 1) of the first embodiment so that the spherical single crystal silicon for which the atmosphere has been replaced can be intermittently sent to the following process.

Figure 5:
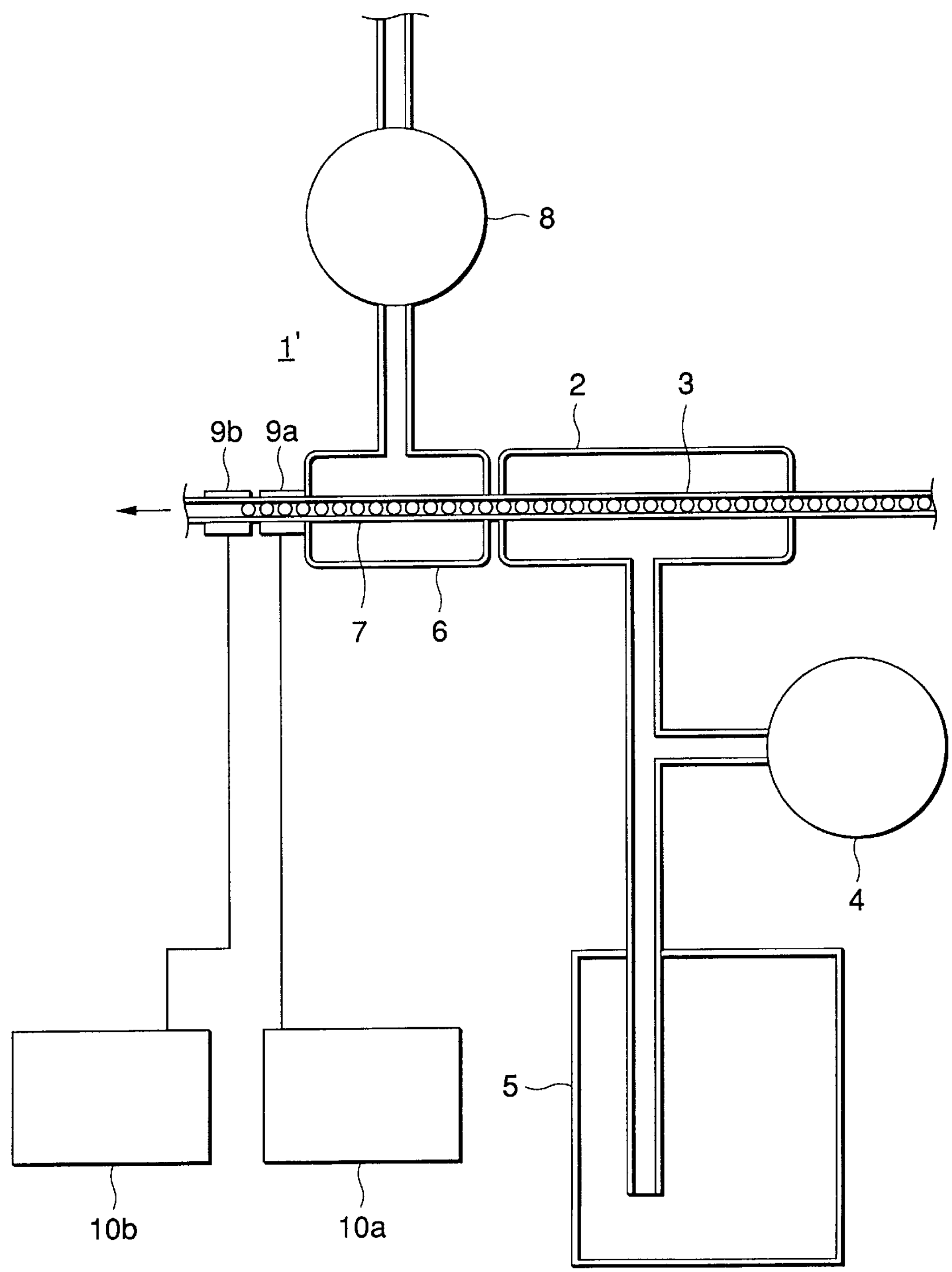
FIG. 5 is a sectional view showing another example of the spherical article conveying atmosphere replacing device, which constitutes a third embodiment of the invention.

In FIG. 5, reference character 1' designates the conveying atmosphere replacing device, the third embodiment; 9*a* and 9*b*, a first piezoelectric element and a second piezo-electric element, respectively, which are mounted on the prolongation of the sending pipe 7; and 10*a* and 10*b*, a first ultrasonic oscillator and a second ultrasonic oscillator which are connected to the first piezoelectric element 9*a* and the second piezoelectric element 9*b*, respectively.

Figure 6A:
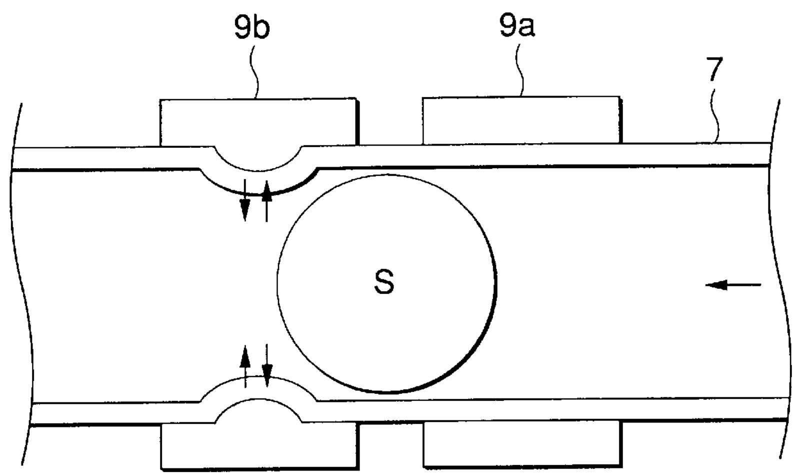
FIGS. 6(*a*), 6(*b*) and 6(*c*) are diagrams for a description of the operations of first and second piezo-electric elements in the device of the invention.
Figure 6B:
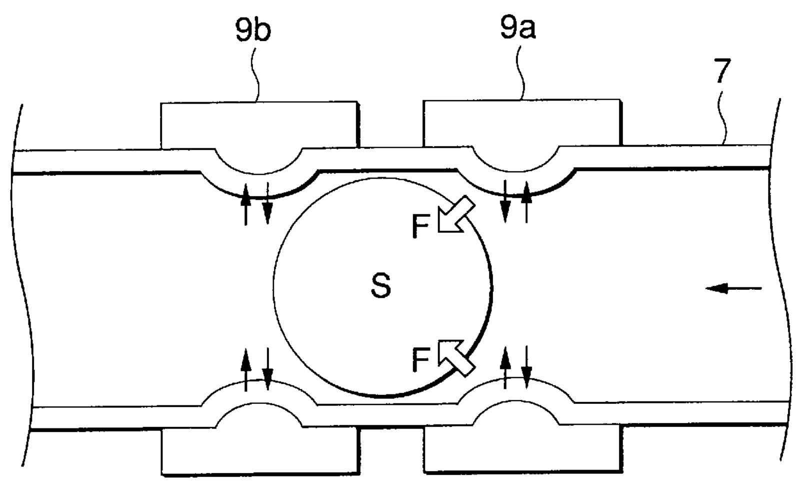
Figure 6C:
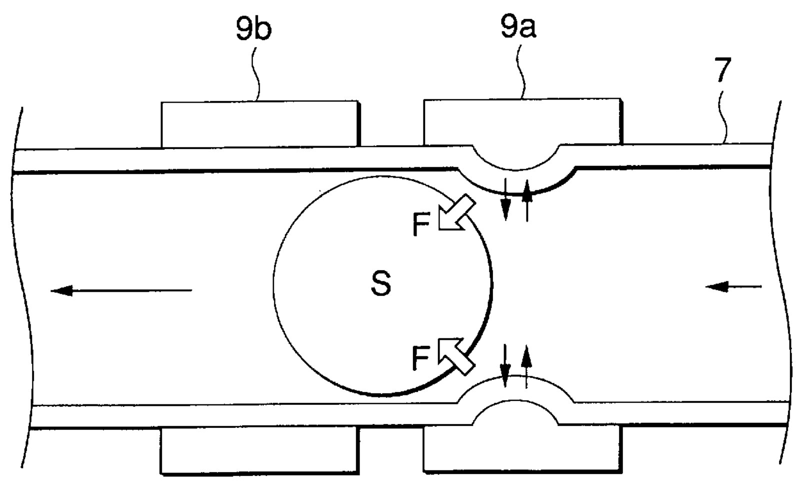

The operation of the conveying atmosphere replacing device 1' will be described with reference to FIG. 6. FIG. 6 is a diagram for a description of the operations of the first and second piezoelectric elements 9*a* and 9*b*.

When, in the conveying atmosphere replacing device 1' shown in FIG. 5, the second ultrasonic oscillator 10*b* is operated to vibrate the second piezoelectric element 9*b*, a pressure is applied to the sending pipe, so that the diameter of the pipe is decreased. Therefore, as shown in the part (a) of FIG. 6, the spherical article S is stopped at the position of the second piezo-electric element 9*b*.

Next, when the first ultrasonic oscillator 10*a* is operated to vibrate the first piezo-electric element 9*a*, thereby to press the sending pipe to decrease the diameter of the pipe as shown in the part (b) of FIG. 6. As a result, a force F is applied to the spherical article S to move the latter downstream of the pipe.

When, under this condition, the second ultrasonic oscillator 10*b* is stopped, to release the sending pipe 7 from the pressure provided by the second piezo-electric element 9*b*, then the spherical article S is conveyed in the sending pipe 7 towards the following process by the flow of the atmosphere from the sending chamber 6 and by the action of the aforementioned force F.

As is apparent from the above description, with the device the spherical articles S can be conveyed to the following process at predetermined time intervals which can be freely and readily determined by setting the operating interval of the first and second ultrasonic oscillators 10*a* and 10*b* to a suitable value.

In the third embodiment, the sending pipe 7 may be formed with any material whose rigidity is such that the sending pipe is deformable by the actions of the first and second piezoelectric elements 9*a* and 9*b*.

The first and second piezo-electric elements 9*a* and 9*b* may be buried in the inner cylindrical surface of the sending pipe 7 so that the spherical article S is directly brought into contact with the piezo-electric elements. In this modification, the spherical article can be positively stopped and conveyed without deformation of the sending pipe 7. In this connection, in order to protect the piezo-electric elements from the atmosphere in the sending pipe 7, it is preferable that the piezo-electric elements are covered with a material such as fluoro-resin which is deformable.

Fourth Embodiment

Another example of the spherical article conveying atmosphere replacing device, which constitutes a fourth embodiment of the invention will be described with reference to FIG. 7.

The device, the fourth embodiment, is obtained as follows: The sending chamber 6 of the first embodiment is rotated at high speed to form a whirling stream in the sending pipe, so that the spherical articles are conveyed to the following process without contacting the inner cylindrical surface of the pipe.

Figure 7:
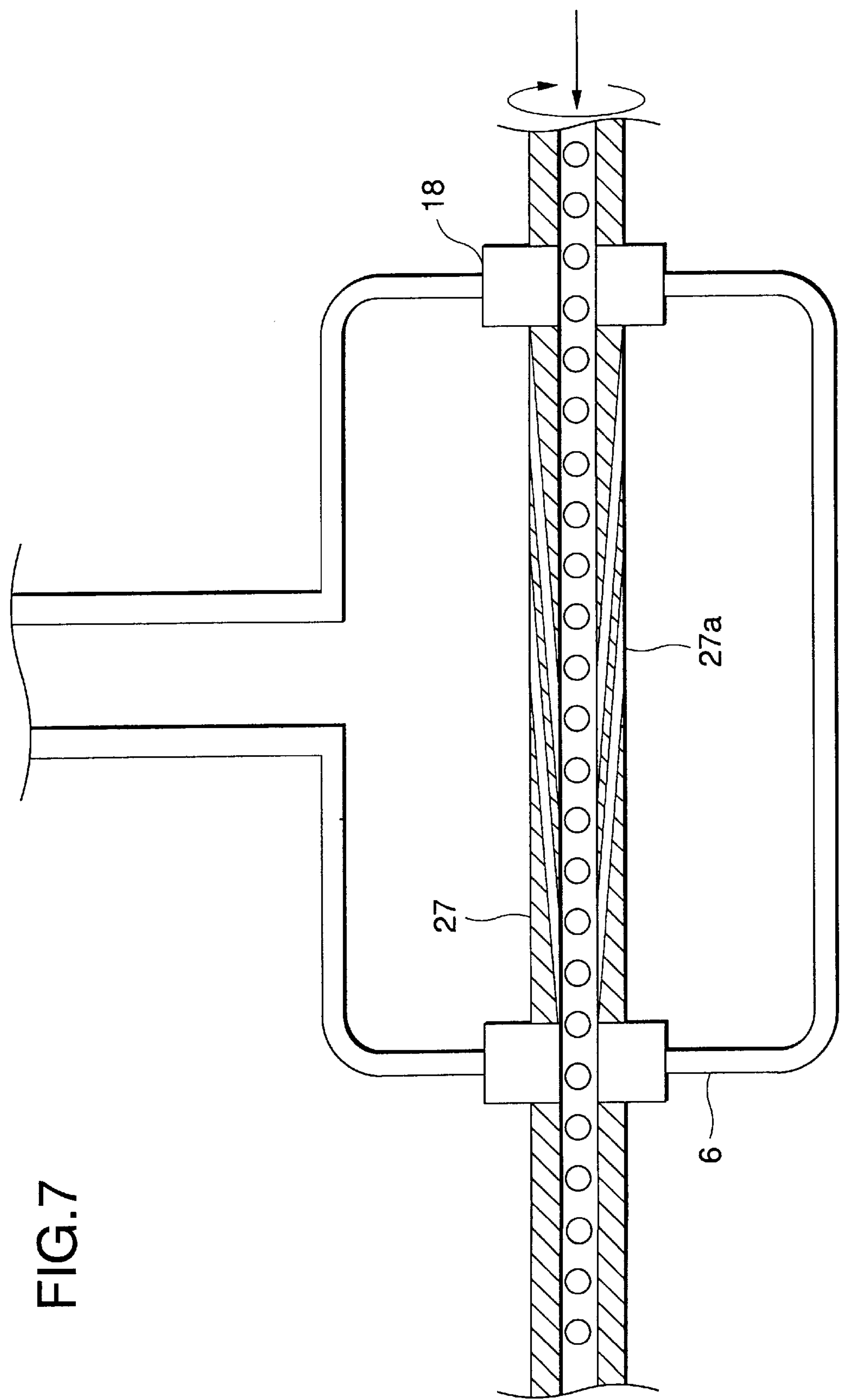
FIG. 7 is a sectional view showing another example of the spherical article conveying atmosphere replacing device, which constitutes a fourth embodiment of the invention.

In the device, as shown in FIG. 7, a sending pipe 27 is provided in the sending chamber 6 with the aid of rotary joints 18, and the sending pipe 27 is rotated at high speed by high-speed rotating means.

In the device, inert gas jetted from the through-holes 27*a* forms a whirling stream inside the sending pipe, so that the spherical articles can be conveyed without contacting the inner cylindrical wall of the pipe.

Furthermore, by intermittently supplying the gas into the sending pipe, the spherical articles can be intermittently conveyed to the following process.

As is apparent from the above description, the invention has the following effects or merits:

Since the pressures in the insides of the recovering pipe and sending pipe are made negative and positive, respectively, it is unnecessary to arrange a member in the direction of conveyance of spherical articles which obstructs the advance of the spherical articles.

Accordingly, although the device is simple in mechanism and in control, the replacement of the atmosphere can be achieved with ease in the process of spherical articles such as spherical single crystal silicons.

In the invention, the recovering pipe is made of porous material. Therefore, the recovering pipe can be formed with ease, and the inside of the recovering pipe can be maintained negative in pressure.

Furthermore, in the invention, the through-holes formed in the side wall of the sending pipe are inclined from the outer cylindrical surface of the sending pipe to the inner cylindrical surface of the latter in the direction of conveyance of spherical articles. Therefore, the spherical articles are more smoothly conveyed.

In the invention, the piezo-electric elements are mounted on the sending pipe in such a manner that they are spaced a predetermined distance from each other. Therefore, the spherical articles can be conveyed at predetermined intervals.

In the invention, the replacement of the atmosphere can be more positively achieved by providing a plurality of recovering chambers or sending chambers.

Furthermore, at least one pair of a gas supplying chamber and a gas discharging chamber may be provided between the recovering chamber and the sending chamber.

In this case, inert gas is supplied into the gas supplying chamber, so that the atmosphere used in the preceding process is replaced with the inert gas; that is, the atmosphere used in the preceding process is discharged more positively.

If the inert gas whose temperature is controlled to a predetermined value is supplied into the gas supplying chamber, then materials to be processed such as spherical single crystal silicon can be led under a predetermined temperature at high speed, and an annealing operation at high temperature can be achieved with ease.

Furthermore, if the reactive gas whose temperature is controlled to a predetermined temperature is supplied into the gas supplying chamber, then materials to be processed such as spherical single crystal silicon in the supplying pipe can be efficiently subjected to a film forming process or etching process with a small quantity of gas.

Moreover, the device may be modified as follows: That is, more than one pair of the gas supplying chambers and the gas discharging chambers are provided, and the gases different in temperature are supplied into the different gas supplying chambers. With the modification, in the oxidizing process of the surfaces of materials to be processed such as spherical single crystal silicon, the oxidizing temperature is controlled in two steps, to form films different in composition. Furthermore, after the oxidizing gas is supplied, a gas containing nitrogen may be supplied, so that the oxide film and the nitride film can be formed in succession.

Furthermore, the device may be modified as follows: The first gas supplying chamber and the first gas discharging chamber located upstream, and the second gas supplying chamber and the second gas discharging chamber located downstream are provided. The first gas supplying chamber is employed as a nitriding chamber into which a gas containing nitrogen is supplied whose temperature is controlled to a nitriding value, to perform a nitrogen annealing operation, while the second gas supplying chamber is employed as a temperature controlling chamber into which gas at room temperature is supplied.

With the modification, during a conveying step of conveying spherical articles from a process to the following process, the nitriding process can be performed with high efficiency.

Furthermore, the device may be modified as follows: More than one pair of the gas supplying chambers and the gas discharging chambers are provided, and gases different in composition are supplied to the different gas supplying chambers.

Moreover, the device may be operated as follows: In the first gas supplying chamber, the first reactive gas whose temperature is controlled to a predetermined value is supplied to the spherical single crystal silicons in the first gas supplying pipe, to form the first film; and then in the second gas supplying chamber, the second reactive gas whose temperature is controlled to a predetermined value is supplied to the spherical single crystal silicon in the second gas supplying pipe, to form the second film. In this case, a super-lattice can be formed with ease that a plurality of so-called "super thin films" which are extremely thin films of the order of one (1) atomic layer in thickness are laminated.

Furthermore, the device may be modified as follows: The rotating means for rotating the sending pipe at high speed with respect to the sending chamber, so that the gas supplied into the sending pipe form a whirling stream. In the modification, the spherical single crystal silicon can be conveyed without contacting the inner cylindrical surface of the pipe; that is, the surfaces of the spherical single crystal silicon are prevented from being damaged.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A spherical article conveying atmosphere replacing device which comprises:

a recovering chamber which a recovering pipe penetrates;

a pressure reducing device for making the inside of said recovering chamber negative in pressure;

a sending chamber which a sending pipe penetrates; and a pressurizing device for making the inside of said sending chamber positive in pressure, said recovering pipe being connected to said sending pipe, through-holes being formed in the side wall of said recovering pipe which is located inside said recovering chamber and in the side wall of said sending pipe which is located inside said sending chamber.

2. The spherical article conveying atmosphere replacing device as claimed in claim 1, wherein said recovering pipe is made of a porous material.

3. The spherical article conveying atmosphere replacing device as claimed in claim 1, wherein said through-holes formed in said side wall of said sending pipe are inclined from the outer cylindrical surface of said sending pipe to the inner cylindrical surface of said sending pipe in the direction of conveyance of materials to be processed.

4. The spherical article conveying atmosphere replacing device as claimed in claim 1, further comprising a plurality of piezo-electric elements mounted on said sending pipe at predetermined intervals so as to locally reduce the inside diameter of said sending pipe.

5. The spherical article conveying atmosphere replacing device as claimed in claim 4, wherein said piezo-electric elements are a first piezo-electric element positioned downstream, and a second piezo-electric element positioned upstream which are arranged with a distance which corresponds substantially to the outside diameter of materials to be processed, so that said first piezo-electric element is operated slightly earlier than said second piezo-electric element, thereby after a material to be processed is held between a first diameter-reducing portion whose diameter is momentarily reduced by said first piezo-electric element and a second diameter-reducing portion whose diameter is reduced by said second piezo-electric element, said first diameter-reducing portion is restored, and said material to be processed is conveyed by a force which is momentarily provided by said second diameter-reducing portion in the direction of conveyance.

6. The spherical article conveying atmosphere replacing device as claimed in claim 1, which comprises a plurality of said recovering chambers or sending chambers.

7. The spherical article conveying atmosphere replacing device as claimed in claim 1, wherein at least one pair of a gas supply chamber and a gas discharging chamber are provided between said recovering chamber and said sending chamber, said gas supplying chamber comprising a gas supplying pipe connected to said recovering pipe, a supplying chamber which said gas supplying pipe penetrates, and a supplying device for supplying gas into said supplying chamber to make said supplying chamber positive in pressure, said gas discharging chamber comprising a gas discharging pipe which is connected to said gas supplying pipe, a discharging chamber which said gas discharging pipe penetrates, and a pressure reducing device for making the inside of said discharging chamber negative in pressure, said gas discharging pipe being coupled to said sending pipe.

8. The spherical article conveying atmosphere replacing device as claimed in claim 1, in which said gas is an inert gas.

9. The spherical article conveying atmosphere replacing device as claimed in claim 8, in which said supplying chamber is so designed that an inert gas whose temperature is controlled to a predetermined value is supplied thereto.

10. The spherical article conveying atmosphere replacing device as claimed in claim 1, wherein said gas is a reactive gas, and said supplying chamber is a reaction chamber to which a reactive gas whose temperature is controlled to a predetermined value is supplied to perform a film forming operation or etching operation.

11. The spherical article conveying atmosphere replacing device as claimed in claim 7, wherein more than one pair of said gas supplying chambers and said gas discharging chambers, and gases supplied into said gas supplying chambers are controlled to different values in temperature.

12. The spherical article conveying atmosphere replacing device as claimed in claim 11, wherein each of said spherical articles is a spherical single crystal silicon, said gas supplying chamber is made up of a first gas supplying chamber located upstream as viewed in the direction of conveyance of spherical articles, and a second gas supplying chamber located downstream, said first gas supplying chamber is a nitriding chamber into which a nitrogen-contained gas whose temperature is controlled to a nitriding temperature, to perform a nitrogen annealing operation, and said second gas supplying chamber is a temperature adjusting chamber adapted to supply gas at room temperature.

13. The spherical article conveying atmosphere replacing device as claimed in claim 7, wherein gases supplied into said gas supplying chambers are different from each other in composition.

14. The spherical article conveying atmosphere replacing device as claimed in claim 13, wherein said gas supplying chamber is made up of a first gas supplying chamber located upstream as viewed in the direction of conveyance of spherical articles, and a second gas supplying chamber located downstream, said first gas supplying chamber is a first film forming chamber into which a first reactive gas whose temperature is controlled to a predetermined value is supplied, to form a first film and said second gas supplying chamber is a second film forming chamber into which a second reactive gas whose temperature is controlled to a predetermined value is supplied, to form a second film.

15. The spherical article conveying atmosphere replacing device as claimed in claim 1, further comprising:

rotating means for rotating said sending pipe at high speed with respect to said sending chamber, so that said gas supplied into said sending pipe forms a whirling stream of gas.

* * * * *